(12) United States Patent
Yamaguchi et al.

(10) Patent No.: US 10,340,174 B2
(45) Date of Patent: Jul. 2, 2019

(54) MOUNTING TABLE AND PLASMA PROCESSING APPARATUS

(71) Applicant: TOKYO ELECTRON LIMITED, Tokyo (JP)

(72) Inventors: Shin Yamaguchi, Miyagi (JP); Daisuke Hayashi, Miyagi (JP); Yasuhisa Kudo, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/160,735

(22) Filed: Jan. 22, 2014

(65) Prior Publication Data

US 2014/0202635 A1 Jul. 24, 2014

Related U.S. Application Data

(60) Provisional application No. 61/759,489, filed on Feb. 1, 2013.

(30) Foreign Application Priority Data

Jan. 22, 2013 (JP) .................................. 2013-009455

(51) Int. Cl.
*C23C 16/44* (2006.01)
*H01L 21/67* (2006.01)
(Continued)

(52) U.S. Cl.
CPC .. *H01L 21/68742* (2013.01); *H01J 37/32715* (2013.01); *H01J 37/32733* (2013.01); *H01L 21/6831* (2013.01); *Y10T 279/23* (2015.01)

(58) Field of Classification Search
CPC ......... H01L 21/68742; C23C 16/45597; C23C 16/466
(Continued)

(56) References Cited

U.S. PATENT DOCUMENTS

| 5,753,891 A | * | 5/1998 | Iwata | ................ H01L 21/67109 219/390 |
| 5,856,906 A | * | 1/1999 | Kholodenko | ..... H01L 21/67109 279/128 |

(Continued)

FOREIGN PATENT DOCUMENTS

| JP | 2000-195935 A | 7/2000 |
| JP | 2004-349516 A | 12/2004 |

(Continued)

*Primary Examiner* — Charlee J C Bennett
(74) *Attorney, Agent, or Firm* — Rothwell, Figg, Ernst & Manbeck, P.C.

(57) ABSTRACT

A mounting table includes an electrostatic chuck having a mounting surface and a backside opposite to the mounting surface, a first through hole being formed in the mounting table; a base joined to the backside of the electrostatic chuck and having a second through hole in communication with the first through hole; a lifter pin which is received in a pin hole formed by the first through hole and the second through hole, the lifter pin being movable up and down to protrude beyond and retract below the mounting surface. An upper end portion of the lifter pin has a shape in which a diameter decreases toward a lower end of the lifter pin to correspond to a shape of the upper end portion of the pin hole. The upper end portion of the lifter pin is in surface contact with the upper end portion of the pin hole.

16 Claims, 18 Drawing Sheets

(51) Int. Cl.
*H01J 37/32* (2006.01)
*H01L 21/687* (2006.01)
*H01L 21/683* (2006.01)

(58) Field of Classification Search
USPC .................................. 156/345.51; 279/128
See application file for complete search history.

(56) References Cited

U.S. PATENT DOCUMENTS

| | | | | |
|---|---|---|---|---|
| 6,035,101 A * | 3/2000 | Sajoto | ................ | C23C 16/4586 |
| | | | | 118/728 |
| 6,148,762 A * | 11/2000 | Fukuda | ............... | C23C 16/4581 |
| | | | | 118/715 |
| 2005/0011456 A1* | 1/2005 | Himori et al. | ................ | 118/724 |
| 2005/0092438 A1* | 5/2005 | Hur et al. | ................ | 156/345.47 |
| 2005/0194100 A1* | 9/2005 | Or et al. | ................ | 156/345.51 |
| 2007/0160507 A1* | 7/2007 | Satoh | ............... | C23C 16/4586 |
| | | | | 422/135 |
| 2008/0230181 A1* | 9/2008 | Higuma | ............... | C23C 16/4581 |
| | | | | 156/345.51 |
| 2010/0109263 A1* | 5/2010 | Jun | ................... | H01L 21/67103 |
| | | | | 279/128 |
| 2010/0163403 A1* | 7/2010 | Kitada | ............... | H01J 37/32082 |
| | | | | 204/164 |
| 2011/0114014 A1* | 5/2011 | Sakurai et al. | ................. | 117/88 |
| 2011/0164955 A1* | 7/2011 | White | ............... | H01L 21/68742 |
| | | | | 414/800 |
| 2011/0272899 A1* | 11/2011 | Shimazu | ....................... | 279/128 |
| 2011/0287631 A1 | 11/2011 | Yamamoto | | |
| 2013/0001899 A1* | 1/2013 | Hwang | ............... | H01L 21/6833 |
| | | | | 279/128 |
| 2014/0265090 A1* | 9/2014 | Hou | ................. | H01L 21/68742 |
| | | | | 269/14 |

FOREIGN PATENT DOCUMENTS

| | | |
|---|---|---|
| JP | 2005-528790 A | 9/2005 |
| JP | 3154629 U | 10/2009 |
| JP | 2010-182763 A | 8/2010 |
| JP | 2011-238825 A | 11/2011 |
| WO | 03/103004 A2 | 12/2003 |

* cited by examiner

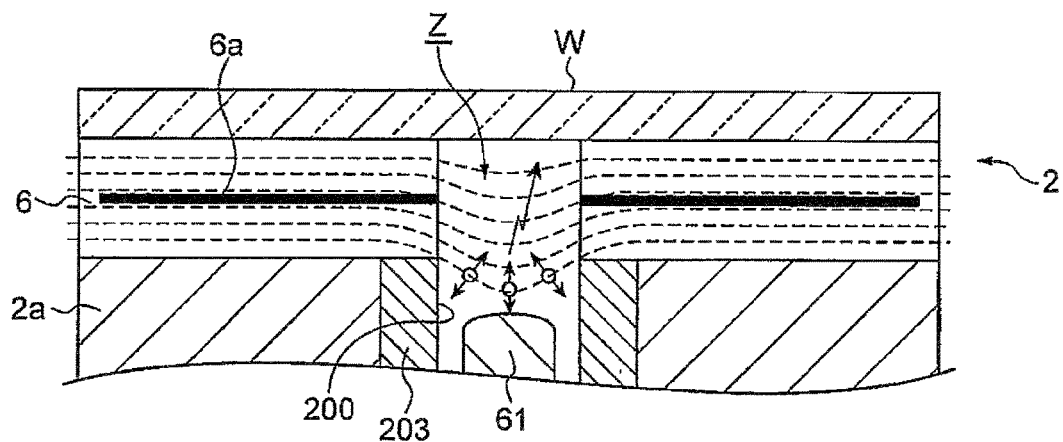
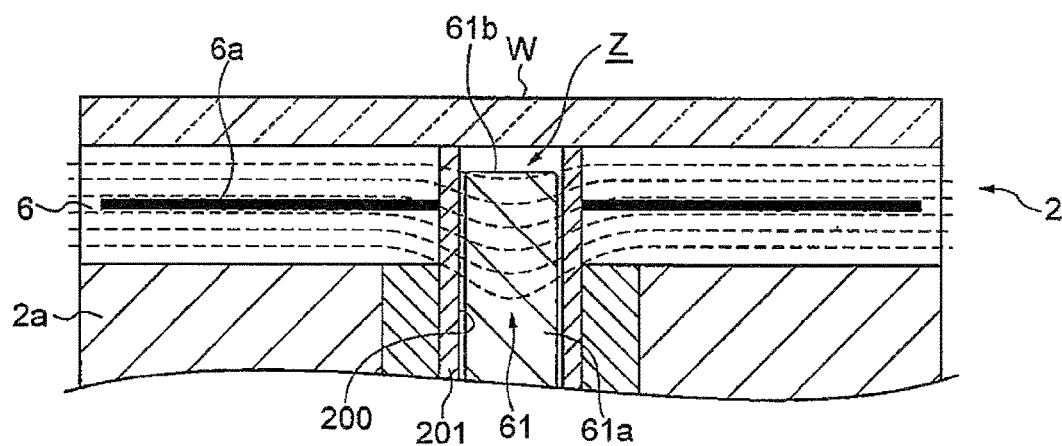

FIG.10

| | POWER OF FIRST RF POWER SUPPLY [W] | POWER OF SECOND RF POWER SUPPLY [W] | PRESSURE OF He [Torr] | CONTROL TEMPERATURE OF MOUNTING TABLE 2 [°C] | RESULTS | | | |
|---|---|---|---|---|---|---|---|---|
| | | | | | Pin-1 DETERMINATION | Pin-2 DETERMINATION | Pin-3 DETERMINATION | He DETERMINATION |
| PROCESS 1 | 2000 | 4000 | 0 | 80 | △ | ○ | ○ | ○ |
| PROCESS 2 | 2000 | 4000 | 10 | 80 | △ | ○ | ○ | ○ |
| PROCESS 3 | 2000 | 4000 | 25 | 80 | △ | ○ | × | △ |

US 10,340,174 B2

MOUNTING TABLE AND PLASMA PROCESSING APPARATUS

CROSS-REFERENCE TO RELATED APPLICATIONS

This application claims priority to Japanese Patent Application No. 2013-009455 filed on Jan. 22, 2013 and U.S. Provisional Application Ser. No. 61/759,489 filed on Feb. 1, 2013, the entire contents of which are incorporated herein by reference.

FIELD OF THE INVENTION

The present invention relates to a mounting table and a plasma processing apparatus.

BACKGROUND OF THE INVENTION

As a conventional plasma processing apparatus, there has been known a plasma processing apparatus including an evacuable processing chamber; a mounting table for mounting thereon a processing target in the processing chamber, the mounting table serving as a lower electrode; and an upper electrode disposed to face the mounting table (see, e.g., Japanese Patent Application Publication Nos. 2011-238825 and 2000-195935). In the plasma processing apparatus described in Japanese Patent Application Publication Nos. 2011-238825 and 2000-195935, by applying high frequency power between the upper electrode and the mounting table serving as the lower electrode, plasma processing is performed on a processing target such as a wafer disposed on the mounting table.

Further, the plasma processing apparatus described in Japanese Patent Application Publication Nos. 2011-238825 and 2000-195935 includes a plurality of lifter pins provided to protrude beyond and retract below the upper surface of the mounting table so as to move up the processing target from the mounting table or move down the processing target onto the mounting table. Further, the mounting table has pin holes for receiving the lifter pins therein. Further, the plasma processing apparatus described in Japanese Patent Application Publication No. 2011-238825 has gas holes for supplying helium gas for heat transfer between the backside of the processing target and the surface of the electrostatic chuck.

In order to prevent a discharge occurring between the mounting table and the processing target, the plasma processing apparatus described in Japanese Patent Application Publication No. 2011-238825 has lifter pins with cover portions provided at the top thereof. When the lifter pins are received in the pin holes, upper portions of the pin holes are in a state of being closed by the cover portions provided at the top of the lifter pins. Further, the plasma processing apparatus described in Japanese Patent Application Publication No. 2000-195935 has lifter pins, upper portions of which are formed in an inverted triangle or corrugated shape in order to prevent abnormal discharge generated by the plasma coming into the inside of the pin holes.

However, in the configuration disclosed in Japanese Patent Application Publication Nos. 2011-238825 and 2000-195935, there is provided a mechanism to move up and down the lifter pins in a vertical direction perpendicular to the backside of the processing target disposed on the mounting table for the function of lifting the processing target onto the mounting table. That is, a radial space required for moving up and down the lifter pins in the vertical direction. Thus, in some cases, it may be impossible to prevent abnormal discharge in the radial space. As a result, it may worsen the quality of the processing target and become a cause of yield deterioration.

SUMMARY OF THE INVENTION

Therefore, in this technical field, a mounting table capable of preventing abnormal discharge and a plasma processing apparatus including the mounting table are desired.

In accordance with a first aspect of the present invention, there is provided a mounting table, including: an electrostatic chuck having a mounting surface on which a processing target is mounted and a backside opposite to the mounting surface, a first through hole being formed in the mounting table; a base joined to the backside of the electrostatic chuck and having a second through hole in communication with the first through hole; a lifter pin which is received in a pin hole formed by the first through hole and the second through hole, the lifter pin being movable up and down to protrude beyond and retract below the mounting surface so as to transfer the processing target in a vertical direction, wherein an upper end portion of the pin hole has a shape in which a diameter decreases gradually toward a lower end of the pin hole, and wherein an upper end portion of the lifter pin has a shape in which a diameter decreases gradually toward a lower end of the lifter pin to correspond to a shape of the upper end portion of the pin hole, the upper end portion of the lifter pin being in surface contact with the upper end portion of the pin hole when the lifter pin is received in the pin hole.

In this mounting table, an upper end part of the pin hole has a shape in which a diameter decreases gradually toward a lower end. An upper end part of the lifter pin has a shape in which a diameter decreases gradually toward a lower end to correspond to a shape of the upper end part of the pin hole. The upper end part of the lifter pin is in surface contact with the upper end part of the pin hole when the lifter pin is received in the pin hole. Therefore, when the lifter pin is received in the pin hole, it is possible to completely eliminate the space in the radial direction in the upper end part of the pin hole. Accordingly, it is possible to prevent abnormal discharge occurring between the lifter pin and the pin hole.

BRIEF DESCRIPTION OF THE DRAWINGS

The objects and features of the present invention will become apparent from the following description of embodiments, given in conjunction with the accompanying drawings, in which:

FIG. 9A is a diagram showing a conventional mounting table 2, and FIG. 9B is a diagram showing the mounting table 2 according to the first embodiment;

FIG. 10 is a table of experimental results showing a relationship between the pressure of He and the abnormal discharge trace of the backside of the wafer;

DETAILED DESCRIPTION OF THE EMBODIMENTS

Hereinafter, various embodiments will be described in detail with reference to the accompanying drawings which form a part hereof. Throughout the drawings, identical or similar parts will be designated by like reference symbols without redundant description. Further, the terms "above" and "below" are based on the state of illustration as a matter of convenience.

(First Embodiment)

Figure 1:
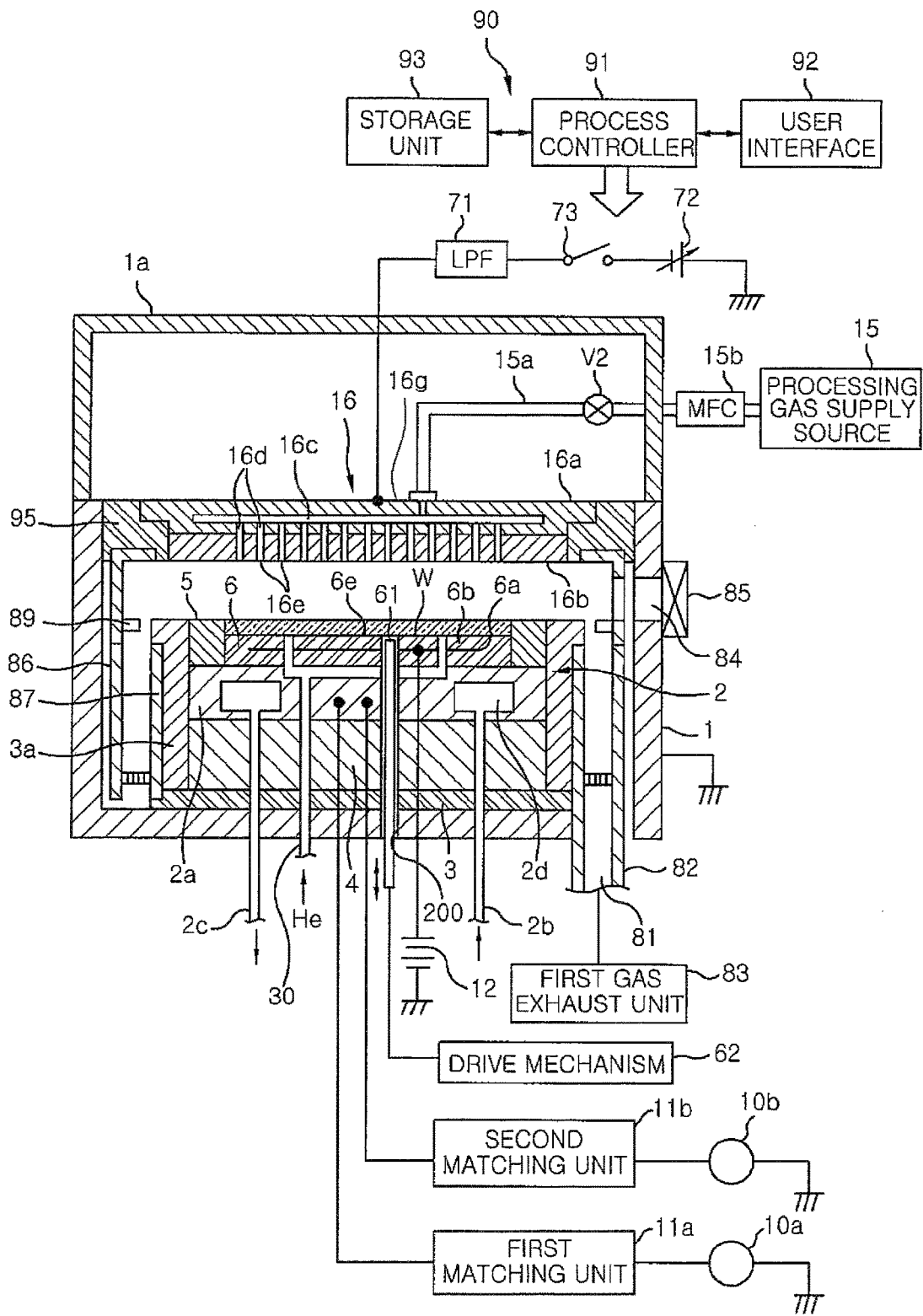
FIG. 1 is a schematic sectional view showing a configuration of a plasma processing apparatus according to a first embodiment of the present invention.

FIG. 1 is a schematic sectional view showing a configuration of a plasma processing apparatus according to an embodiment of the present invention. The plasma processing apparatus includes a processing chamber 1, which is airtightly sealed and is electrically grounded. The processing chamber 1 is formed in a cylindrical shape, and is made of, e.g., aluminum or the like. The processing chamber 1 defines a processing space in which a plasma is generated. In the processing chamber 1, there is provided a mounting table 2 for horizontally supporting a semiconductor wafer (hereinafter, simply referred to as "wafer") W which is a processing target (work piece). The mounting table 2 is configured to include a base 2a and an electrostatic chuck 6. The base 2a is formed of conductive metal such as aluminum, and functions as a lower electrode. The electrostatic chuck 6 has a function of electrostatically attracting and holding the wafer W. The mounting table 2 is supported on a conductive support 4 provided through an insulating plate 3 at a bottom portion of the processing chamber 1. Further, a focus ring 5 made of, e.g., single-crystalline silicon is provided at the outer periphery on the mounting table 2. Further, a cylindrical inner wall member 3a made of, e.g., quartz or the like is provided to surround the mounting table 2 and the support 4.

The base 2a is connected to a first RF power supply 10a via a first matching unit 11a, and also connected to a second RF power supply 10b via a second matching unit 11b. The first RF power supply 10a is provided for plasma generation, and is configured to supply a high frequency power having a predetermined frequency to the base 2a of the mounting table 2. Further, the second RF power supply 10b is provided for ion attraction (bias), and is configured to supply a high frequency power having a predetermined frequency lower than the frequency of the first RF power supply 10a to the base 2a of the mounting table 2. Thus, the mounting table 2 is configured such that a voltage can be applied thereto. Meanwhile, above the mounting table 2, a shower head 16 functioning as an upper electrode is provided to face the mounting table 2 in parallel. The shower head 16 and the mounting table 2 function as a pair of electrodes (upper electrode and lower electrode).

The electrostatic chuck 6 includes an insulator 6b, an electrode 6a embedded in the insulator 6b, and a DC power supply 12 is connected to the electrode 6a. The wafer W is attracted and held on the electrostatic chuck 6 by a Coulomb force generated by applying a DC voltage from the DC power supply 12 to the electrode 6a.

A coolant passage 2d is formed in the mounting table 2, and a coolant inlet line 2b and a coolant outlet line 2c are connected to the coolant passage 2d. The mounting table 2 may be controlled to a predetermined temperature by circulating a proper coolant such as cooling water in the coolant passage 2d. Further, a gas supply line 30 for supplying a cold heat transfer gas (backside gas) such as helium gas or the like to the backside of the wafer W is provided to pass through the mounting table 2 and the like, and the gas supply line 30 is connected to a gas supply source (not shown). With such configurations, the wafer W, which is attracted and held on the top surface of the mounting table 2 by the electrostatic chuck 6, is controlled to a predetermined temperature. The structure of the gas supply line 30 will be described later.

A plurality of, e.g., three, pin holes 200 are provided in the mounting table 2 (only one is shown in FIG. 1), and lifter pins 61 are disposed in the pin holes 200, respectively. The lifter pins 61 are connected to a drive mechanism 62, and are moved up and down by the drive mechanism 62. The structure of the pin holes 200 and the lifter pins 61 will be described later.

The shower head 16 is disposed at a ceiling portion of the processing chamber 1. The shower head 16 includes a main body 16a and an upper ceiling plate 16b serving as an electrode plate. The shower head 16 is supported at an upper portion of the processing chamber 1 through an insulating member 95. The main body 16a is made of a conductive material, e.g., aluminum having an anodically oxidized surface, and is configured to detachably hold the upper ceiling plate 16b provided under the main body 16a.

A gas diffusion space 16c is formed in the main body 16a. A plurality of gas holes 16d are formed at a bottom portion of the main body 16a so as to be positioned under the gas diffusion space 16c. Further, gas injection holes 16e are formed in the upper ceiling plate 16b so as to pass therethrough in its thickness direction and communicate with the gas holes 16d. With such configurations, a processing gas supplied to the gas diffusion space 16c is dispersed and supplied in a shower shape into the processing chamber 1 through the gas holes 16d and the gas injection holes 16e.

A gas inlet port 16g for introducing the processing gas into the gas diffusion space 16c is formed at the main body 16a. The gas inlet port 16g is connected to one end of a gas supply line 15a. The other end of the gas supply line 15a is connected to a processing gas supply source (gas supply unit) 15 for supplying a processing gas. A mass flow controller (MFC) 15b and a valve V2 are sequentially provided in the gas supply line 15a from its upstream side.

Then, the processing gas for plasma etching is supplied to the gas diffusion space 16c through the gas supply line 15a from the processing gas supply source 15. The processing gas is dispersed and supplied in a shower shape into the processing chamber 1 from the gas diffusion space 16c through the gas holes 16d and the gas injection holes 16e.

A variable DC power supply 72 is electrically connected to the shower head 16 serving as the upper electrode via a low pass filter (LPF) 71. The power supply of the variable DC power supply 72 may be on-off controlled by an on/off switch 73. The current and voltage supplied from the variable DC power supply 72 and the on/off operation of the on/off switch 73 are controlled by a control unit 90 to be described later. As will be described later, when a plasma is generated in the processing space by applying the RF powers to the mounting table 2 from the first RF power supply 10a and the second RF power supply 10b, the on/off switch 73 is turned on by the control unit 90 if necessary and, thus, a predetermined DC voltage is applied to the shower head 16 serving as the upper electrode.

A cylindrical ground conductor 1a is provided to extend upward from a sidewall of the processing chamber 1 to be higher than the shower head 16. The cylindrical ground conductor 1a has an upper ceiling wall.

A gas exhaust port 81 is formed at a bottom portion of the processing chamber 1, and a first gas exhaust unit 83 is connected to the gas exhaust port 81 through a gas exhaust line 82. By operating a vacuum pump included in the first gas exhaust unit 83, the processing chamber 1 may be depressurized to a predetermined vacuum level. Meanwhile, a loading/unloading port 84 for the wafer W is provided at a sidewall of the processing chamber 1, and a gate valve 85 for opening and closing the loading/unloading port 84 is provided at the loading/unloading port 84.

In the processing chamber 1, a deposition shield 86 is provided along the inner wall surface of the processing chamber 1. The deposition shield 86 prevents etching by-products (deposits) from being attached to the processing chamber 1. At the height substantially equal to that of the wafer W in the deposition shield 86, there is provided a conductive member (GND block) 89 whose potential is controllable with respect to the ground and, thus, abnormal discharge is prevented. Further, a deposition shield 87 extending along the inner wall member 3a is provided in a lower portion of the mounting table 2. The deposition shields 86 and 87 are detachably provided.

The entire operation of the plasma processing apparatus having the above-described configuration is controlled by the control unit 90. The control unit 90 includes a process controller 91 having a CPU to control each unit of the plasma processing apparatus, a user interface 92, and a storage unit 93.

The user interface 92 includes a keyboard for inputting a command, a display unit for visually displaying an operation status of the plasma processing apparatus, and the like to allow a process manager to manage the plasma processing apparatus.

The storage unit 93 stores recipes including control programs (software) for implementing various processes performed in the plasma processing apparatus under the control of the process controller 91, process condition data and the like. If necessary, a desired recipe is retrieved from the storage unit 93 in accordance with instructions inputted through the user interface 92 and executed in the process controller 91. Accordingly, a desired process is performed in the plasma processing apparatus under the control of the process controller 91. Further, the recipes including control programs, process condition data and the like may be retrieved from a computer readable storage medium (e.g., a hard disk, a CD, a flexible disk, a semiconductor memory or the like), or retrieved on-line through, e.g., a dedicated line from another apparatus whenever necessary.

Figure 2:
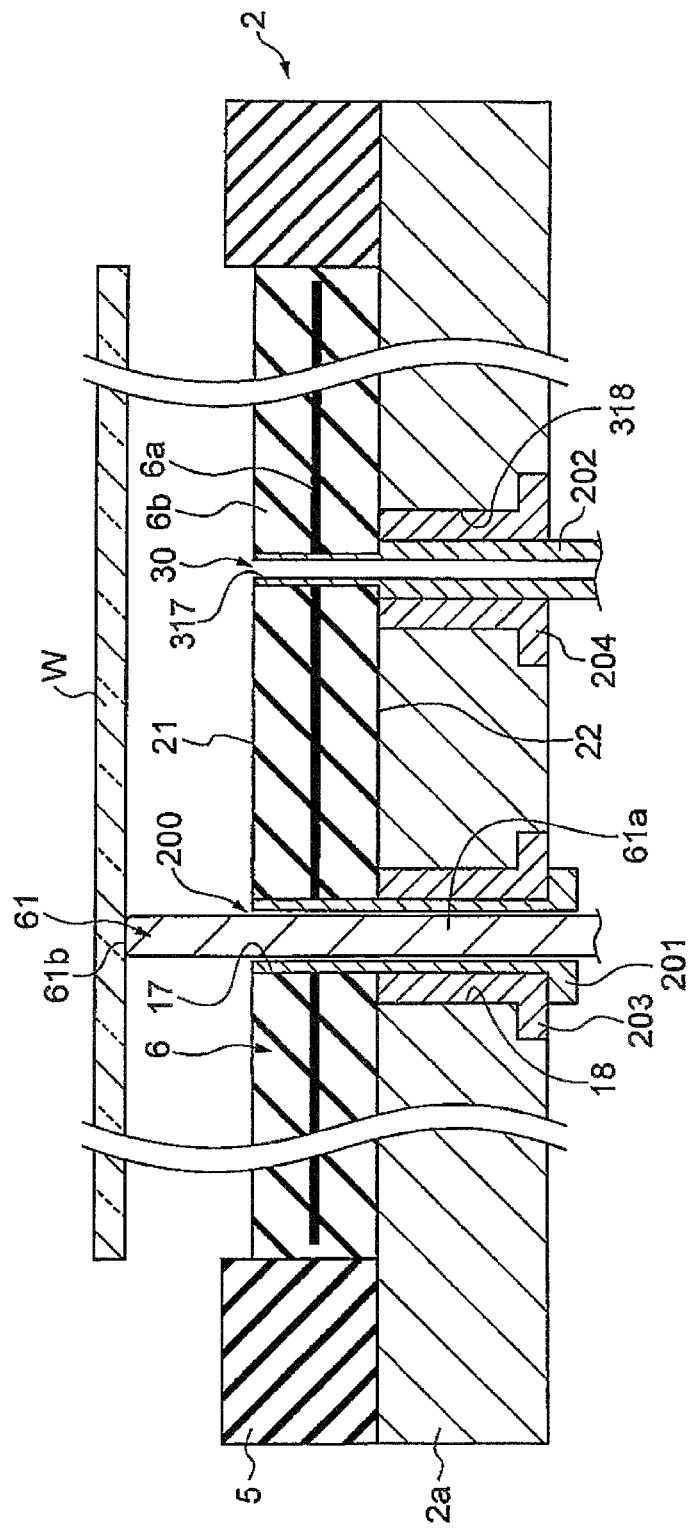
FIG. 2 is a schematic cross-sectional view showing the mounting table in the plasma processing apparatus of FIG. 1.
Figure 3:
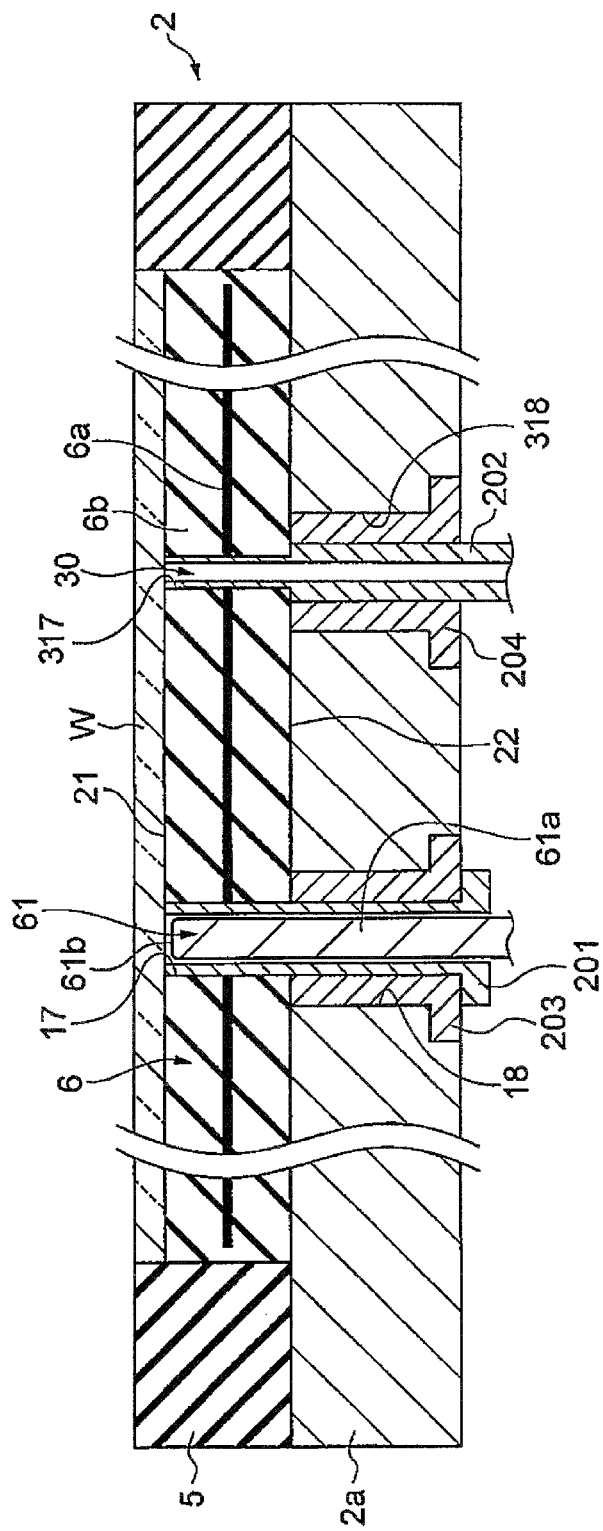
FIG. 3 is a schematic cross-sectional view showing the mounting table in the plasma processing apparatus of FIG. 1.

Next, a configuration of a main part of the mounting table 2 will be described with reference to FIGS. 2 and 3. FIGS. 2 and 3 are schematic cross-sectional views showing the mounting table 2 in the plasma processing apparatus of FIG. 1. FIG. 2 shows a case in which the wafer W is supported by the lifter pins 61 that have been raised, and FIG. 3 shows a case in which the wafer W is supported on the electrostatic chuck 6 by lowering the lifter pins 61. As described above, the mounting table 2 includes the base 2a and the electrostatic chuck 6, and is configured such that the lifter pins 61 can be moved through the mounting table 2 from below the base 2a to above the electrostatic chuck 6.

The electrostatic chuck 6 has a disk shape, and includes a mounting surface 21 on which the wafer W is mounted, and a backside 22 opposed to the mounting surface. The mounting surface 21 has a circular shape and supports a disk-shaped wafer by contacting the backside of the wafer W. The base 2a is joined to the backside 22 of the electrostatic chuck 6.

On the mounting surface 21, an end portion (gas holes) of the gas supply line 30 is formed. The gas supply line 30 supplies a helium gas or the like for cooling. The end portion of the gas supply line 30 includes first gas holes 317 and second gas holes 318. The first gas holes 317 are provided to pass through the electrostatic chuck 6 from the backside 22 of the electrostatic chuck 6 to the mounting surface 21. That is, the inner walls of the first gas holes 317 are formed by the electrostatic chuck 6. The second gas holes 318 are provided to pass through the base 2a from the backside of the base 2a to the joint surface with the electrostatic chuck 6. That is, the inner walls of the second gas holes 318 are formed by the base 2a. For example, the diameter of the second through holes is larger than that of the first through holes. Further, the electrostatic chuck 6 and the base 2a are disposed such that the first gas holes 317 communicate with the second gas holes 318. Gas sleeves 204 and gas spacers 202 are disposed in the gas supply line 30. Further, it is preferable that ends of the electrode 6a do not contact with the gas sleeves 204 and the gas spacers 202. The detailed description of the gas sleeves 204 and the gas spacers 202 will be given later.

Further, the pin holes 200 for receiving the lifter pin 61 are formed in the mounting surface 21. The pin hole 200 has a larger diameter that of the gas hole of the line 30. The pin hole 200 includes a first through hole 17 and a second through hole 18. The first through hole 17 is formed in the electrostatic chuck 6, and the second through hole 18 is formed in the base 2a. The first through hole 17 of each pin hole 200 has a diameter suitable for the outer diameter of the lifter pin 61, i.e., a diameter slightly larger (for example, about 0.1 to 0.5 mm greater) than the outer diameter of the lifter pin 61 to accommodate the lifter pin 61 therein. The diameter of the second through hole 18 is larger than, for example, the diameter of the first through hole 17. Further, a pin sleeve 203 and a pin spacer 201 are disposed between each of the lifter pin 61 and the inner walls of the first through hole 17 and the second through hole 18. The detail description of the pin sleeve 203 and the pin spacer 201 will be given later.

The lifter pin 61 includes a pin main body 61a and a pin upper portion 61b formed of insulating ceramics or resin in a pin shape. The pin main body 61a has a cylindrical shape, and has an outer diameter of, e.g., several mm. The pin upper portion 61*b* is formed by chamfering the pin main body 61*a*, and has a spherical surface. The spherical surface has a very large curvature such that the entire pin upper portion 61*b* of the lifter pin 61 is brought close to the backside of the wafer W. The lifter pins 61 are moved vertically in the pin holes 200 by the drive mechanism 62 shown in FIG. 1 to protrude beyond and retract below the mounting surface 21 of the mounting table 2. Further, the drive mechanism 62 adjusts the height of the stop position of the lifter pins 61 such that the pin upper portions 61*b* of the lifter pin 61*s* are positioned immediately under the backside of the wafer W when the lifter pins 61 are received.

As shown in FIG. 2, in a state in which the lifter pins 61 are raised, a part of the pin main body 61*a* and the pin upper portion 61*b* of each lifter pin 61 protrude beyond the mounting surface 21 of the mounting table 2, and the wafer W is supported above the mounting table 2. On the other hand, as shown in FIG. 3, in a state in which the lifter pins 61 are lowered, the pin main body 61*a* of each lifer pin 61 is received in the corresponding pin hole 200, and the wafer W is mounted on the mounting surface 21. Thus, the lifter pins 61 move the wafer W in a vertical direction.

Figure 4A:
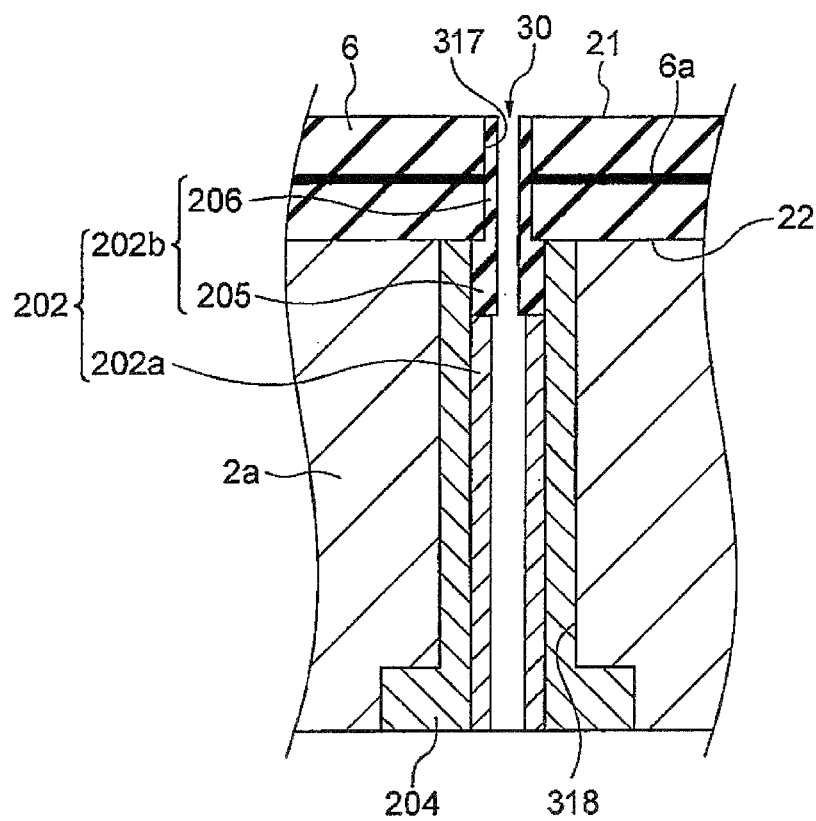
FIG. 4A is a schematic cross-sectional view schematically showing a configuration of the gas hole in the mounting table of FIGS. 2 and 3 and FIG. 4B shows a modified example of that shown in FIG. 4A.
Figure 5:
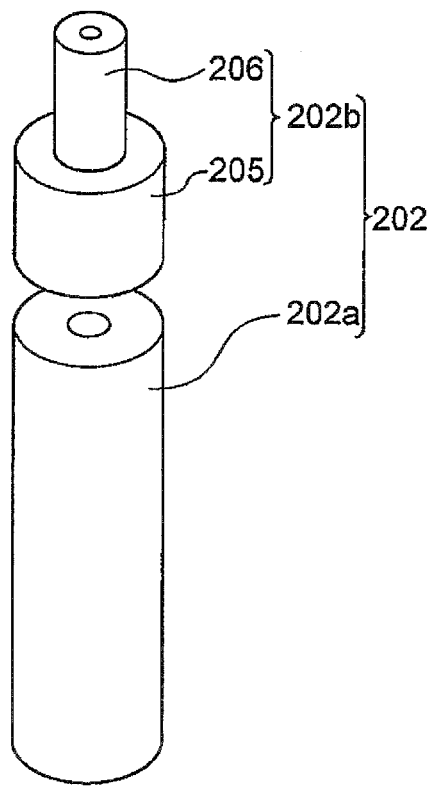
FIG. 5 is a perspective view schematically showing a configuration of the gas spacer of FIG. 4A.

Next, a detailed configuration of the gas sleeve 204 and the gas spacer 202 disposed in the gas supply line 30 will be described with reference to FIGS. 4A and 5. FIG. 4A is a schematic cross-sectional view schematically showing a configuration of the gas hole in the mounting table 2. FIG. 5 is a perspective view schematically showing a configuration of the gas spacer 202.

As shown in FIG. 4A, the gas sleeve 204 is disposed in the second gas hole 318 forming the gas supply line 30. The gas sleeve 204 is made of an insulating material such as ceramics, and has a cylindrical shape. Then, the gas sleeve 204 has an outer diameter substantially equal to the diameter of the second gas hole 318 to be in contact with the base 2*a* in the second gas hole 318. The gas sleeve 204 is mounted to be inserted into the second gas hole 318 toward the upper surface from the lower surface of the base 2*a*. The gas sleeve 204 has an inner diameter (e.g., several mm) smaller than the diameter of the second gas hole 318.

The gas spacer 202 made of an insulating material such as resin (e.g., polyimide) is inserted into the gas sleeve 204. The gas spacer 202 is inserted into the gas sleeve 204 mounted in the second gas hole 318 toward the upper surface from the lower surface of the base 2*a*, and also inserted into the first gas hole 317, so that the gas spacer 202 is fitted in the first gas hole 317 and the gas sleeve 204.

As shown in FIGS. 4A and 5, the gas spacer 202 has a spacer main body 202*a* and a spacer end portion 202*b*. The spacer main body 202*a* has a cylindrical shape. The spacer end portion 202*b* in the electrostatic chuck 6 has a cylindrical shape and has an inner diameter smaller than that of the spacer main body 202*a*. By reducing the inner diameter of the spacer end portion 202*b* to decrease a mean free path, a flow speed of the cold heat transfer gas can be increased and no abnormal discharge occurs in the spacer end portion 202*b*. Further, the spacer end portion 202*b* includes, for example, a main body extension portion 205 (in the base 2*a*) having an outer diameter substantially equal to the outer diameter of the spacer main body 202*a* and a plug portion 206 (in the electrostatic chuck 6) having an outer diameter smaller than the outer diameter of the spacer main body 202*a*. While the spacer end portion 202*b*' has the inner diameter smaller than that of the spacer main body 202*a* in the present embodiment, the spacer end portion 202*b*' may have the inner diameter equal to that of the spacer main body 202*a* as shown in FIG. 4B.

Figure 4B:
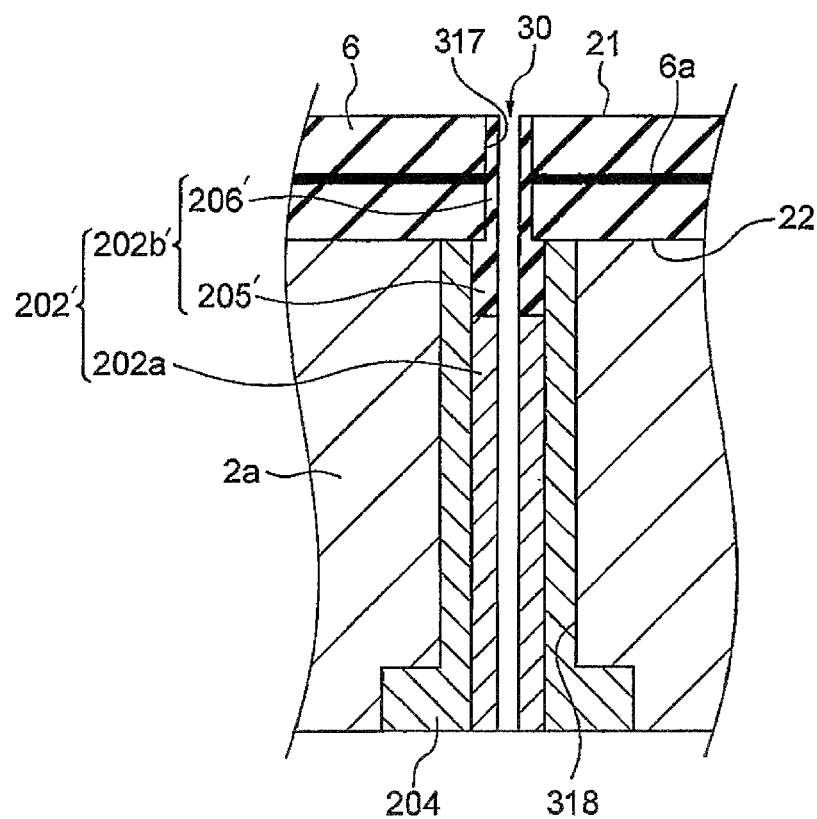

As shown in FIGS. 4A and 4B, by connecting the main body extension portion 205 to the spacer main body 202*a*, the spacer end portion 202*b* is integrated with the spacer main body 202*a* and inserted into the gas sleeve 204. The main body extension portion 205 and the spacer main body 202*a* are disposed to be received in the gas sleeve 204. The plug portion 206 is disposed in the first through hole 17 to extend to the mounting surface 21 from the backside 22 of the electrostatic chuck 6. Thus, the gas spacer 202 extends to cover the inner wall of the gas sleeve 204 and the inner wall of the first through hole 17. By inserting the gas spacer 202, a radial space in the gas supply line 30 becomes smaller compared to a case when the gas spacer 202 is not inserted.

Figure 6:
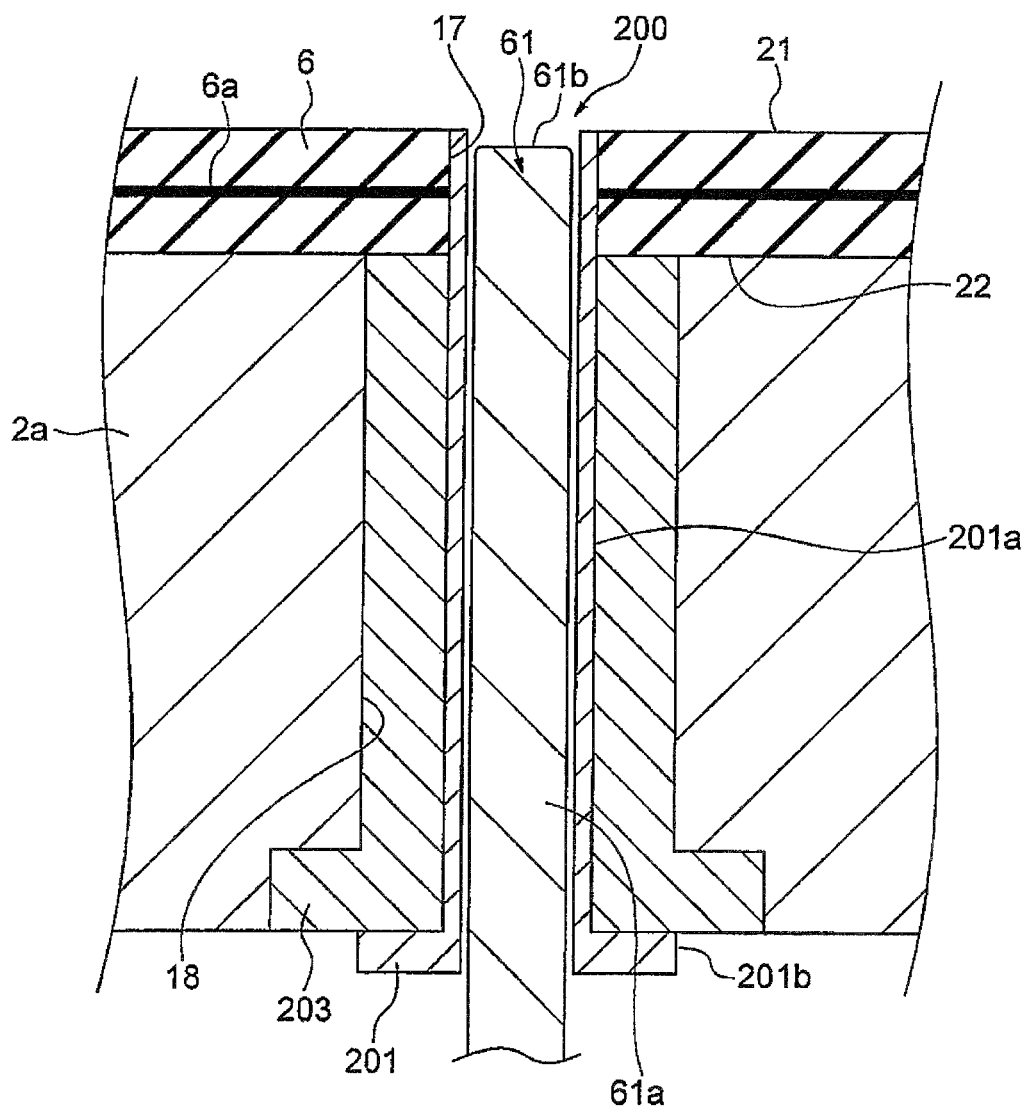
FIG. 6 is a schematic cross-sectional view showing a configuration of the pin hole in the mounting table of FIGS. 2 and 3.
Figure 7:
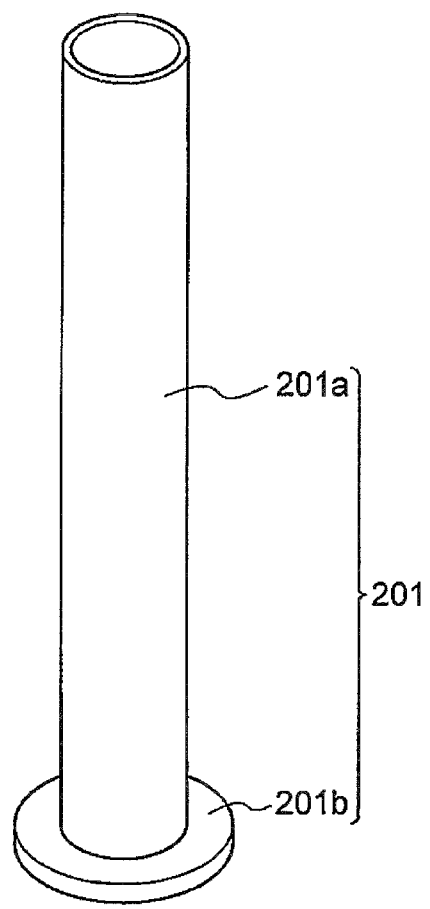
FIG. 7 is a perspective view schematically showing a configuration of the pin spacer of FIG. 6.

Next, a detailed configuration of the pin sleeve 203 and the pin spacer 201 disposed in each of the pin holes 200 will be described with reference to FIGS. 6 and 7. FIG. 6 is a schematic cross-sectional view schematically showing a configuration of the pin hole 200 in the mounting table 2. FIG. 7 is a perspective view schematically showing a configuration of the pin spacer 201.

As shown in FIG. 6, the pin sleeve 203 is disposed in each of the second pin holes 18 of the pin holes 200. The pin sleeve 203 is made of an insulating material such as ceramics, and has a cylindrical shape. The pin sleeve 203 has an outer diameter substantially equal to the diameter of the second through hole 18 to be in contact with the base 2*a* in the second through hole 18. The pin sleeve 203 is fitted into the second through hole 18 toward the upper surface from the lower surface of the base 2*a*. The pin sleeve 203 has an inner diameter (e.g., several mm) smaller than the diameter of the second through hole 18 and larger than the outer diameter of the lifter pin 61.

The pin spacer 201 made of an insulating material such as resin (e.g., polyimide) is inserted into the pin sleeve 203. The pin spacer 201 is inserted into the pin sleeve 203 fitted in the second through hole 18 toward the upper surface from the lower surface of the base 2*a*, and also inserted into the first through hole 17, so that the pin spacer 201 is fitted in the first through hole 17 and the pin sleeve 203.

As shown in FIGS. 6 and 7, the pin spacer 201 has a cylindrical accommodating portion 201*a* and a flange portion 201*b* formed at one end of the accommodating portion 201*a* to protrude outwardly in a radial direction. The accommodating portion 201*a* has a cylindrical shape having a thickness of, e.g., several hundred μm or less. The accommodating portion 201*a* has an inner diameter larger than the outer diameter of the pin main body 61*a*. Meanwhile, the flange portion 201*b* has a flange shape to protrude outwardly in the radial direction of the accommodating portion 201*a*, and has a sufficient area to be fixed to the base 2*a*.

As shown in FIG. 6, in a state in which the upper surface of the flange portion 201*b* is fixed to the lower surface of the base 2*a*, the pin spacer 201 is inserted into the pin sleeve 203. Further, the accommodating portion 201*a* of the pin spacer 201 is disposed to extend to the mounting surface 21 of the electrostatic chuck 6 from the backside of the base 2*a*. Thus, the pin spacer 201 extends to cover the inner wall of the pin sleeve 203 and the inner wall of the first through hole 17. By inserting the pin spacer 201, a space where the lifter pin 61 does not exist in the pin hole 200, i.e., a space between the inner wall of the first through hole 17 and the lifter pin 61 and a space between the inner wall of the pin sleeve 203 and the lifter pin 61 become smaller. That is, by inserting the pin spacer 201, a space in the radial direction in the pin hole 200 becomes smaller compared to a case where the pin spacer 201 is not inserted. Therefore, as shown in FIG. 3, when the lifter pin 61 is lowered to be received in the pin hole 200, there is almost no space in the pin hole 200.

Figure 8:
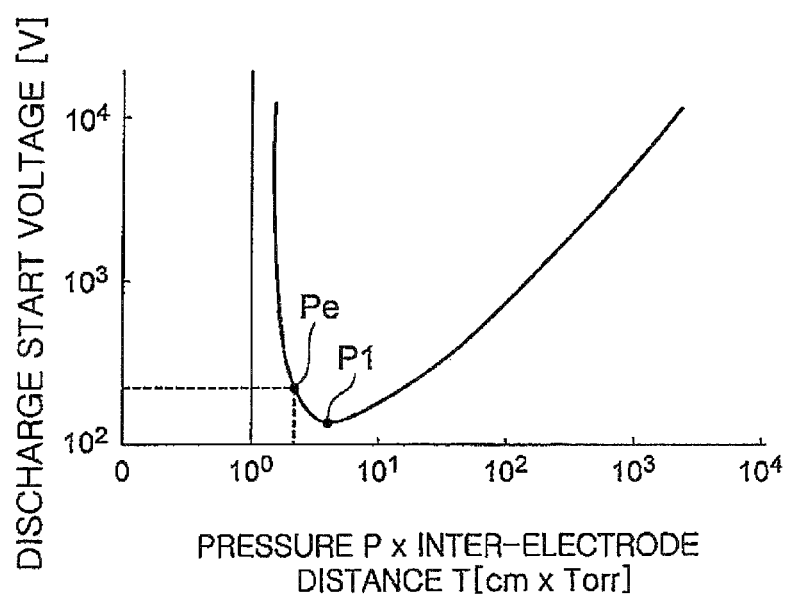
FIG. 8 is a diagram showing a curve of the discharge start voltage according to Paschen's law.

A discharge start voltage according to Paschen's law will now be described with reference to FIG. 8. FIG. 8 is a diagram showing a curve of the discharge start voltage according to Paschen's law. The horizontal axis represents a product between a pressure P of a helium gas and an inter-electrode distance T, and the vertical axis represents a discharge start voltage. The horizontal axis and the vertical axis are represented on a logarithmic scale. For example, as represented as a point Pe in FIG. 8, if the product between the pressure P and the inter-electrode distance T is 2.0 cm·Torr, the discharge start voltage is about 200 V. If the voltage becomes, e.g., 54 V under same the conditions of the pressure P and the inter-electrode distance T, since the value of the voltage is smaller than about 200 V that is the discharge start voltage and there is a margin of about four times, discharge does not occur. On the other hand, if the voltage becomes, for example, 300 V under the same conditions, since the value of the voltage is greater than the discharge start voltage of about 200 V, discharge occurs.

As shown in FIG. 8, the discharge start voltage has a minimum value P1 to the product between the pressure P and the inter-electrode distance T. At the minimum value P1, the pressure P and the inter-electrode distance T have values at which discharge is most likely to occur. Further, the discharge start voltage increases as it goes to the right from the boundary of this minimum value P1, i.e., as the product between the pressure P and the inter-electrode distance T increases. For example, when the inter-electrode distance T is set as the inter-electrode distance T at the minimum value P1 and the pressure P is increased from the pressure P at the minimum value P1, the discharge start voltage is increased. This is because, since the number of He atoms present between electrodes increases and a mean free path becomes small when the pressure P increases, electrons collide with He atoms before obtaining sufficient kinetic energy even though they are accelerated by the electric field. Similarly, for example, when the pressure P is set as the pressure P at the minimum value P1 and the inter-electrode distance T is increased from the inter-electrode distance T at the minimum value P1, the discharge start voltage is increased. This is because sufficient kinetic energy cannot be obtained since the acceleration force due to the electric field is reduced if the inter-electrode distance T becomes longer. Thus, as it goes to the right from the boundary of the minimum value P1, i.e., as the product between the pressure P and the inter-electrode distance T increases, the discharge start voltage increases.

On the other hand, as it goes to the left from the boundary of the minimum value P1, i.e., as the product between the pressure P and the inter-electrode distance T decreases, the discharge start voltage increases. For example, when the inter-electrode distance T is set as the inter-electrode distance T at the minimum value P1 and the pressure P is reduced from the pressure P at the minimum value P1, the discharge start voltage increases. This is because it is difficult for the accelerated electrons to collide with He atoms since the number of He atoms present between the electrodes is reduced. Similarly, when the pressure P is set as the pressure P at the minimum value P1 and the inter-electrode distance T is reduced from the inter-electrode distance T at the minimum value P1, the discharge start voltage increases. This is because a space for accelerating electrons is insufficient. Thus, as it goes to the left from the boundary of the minimum value P1, i.e., as the product between the pressure P and the inter-electrode distance T decreases, the discharge start voltage increases.

Therefore, in order to increase the discharge start voltage, apparatus or process conditions corresponding to the right or left side of the minimum value P1 may be used. That is, if the product between the pressure P and the inter-electrode distance T is set to be greater or smaller than the minimum value P1, discharge may be difficult in the backside of the wafer W. However, the curve of the discharge start voltage increases gradually on the right side of the minimum value. Thus, even if apparatus or process conditions are changed to make the product between the pressure P and the inter-electrode distance T to be greater than the minimum value P1, since the discharge start voltage is not increased dramatically, it reaches the discharge start voltage if the voltage between electrodes is raised. Thus, even if apparatus or process conditions are changed to make the product between the pressure P and the inter-electrode distance T to be greater than the minimum value P1, it may not be possible to suitably prevent the discharge in the backside of the wafer W. On the other hand, on the left side of the minimum value P1, the curve rises rapidly along an asymptote of the product PT=1 between the pressure P and the inter-electrode distance T. Accordingly, if apparatus or process conditions are changed to make the product between the pressure P and the inter-electrode distance T to be smaller than the minimum value P1, the discharge start voltage increases dramatically. Further, since the asymptote is present, if the inter-electrode distance T becomes smaller, it may be impossible to ensure the distance required for acceleration of the electrons, namely, it may be impossible to generate discharge no matter how much the voltage between electrodes is raised. Therefore, it is possible to more efficiently prevent the discharge in the case of changing apparatus or process conditions to make the product between the pressure P and the inter-electrode distance T to be smaller than the minimum value P1 than the case of changing apparatus or process conditions to make the product between the pressure P and the inter-electrode distance T to be greater than the minimum value P1. Therefore, in order to increase the discharge start voltage, it is more efficient and effective under the apparatus or process conditions corresponding to the left side of the minimum value P1 rather than the right side of the minimum value P1. Thus, according to the Paschen's law, it is considered to be more difficult to generate discharge by reducing the inter-electrode distance T, i.e., a space in which the electric field is generated. Further, reducing the size of the space that exists locally on the backside of the wafer W, i.e., reducing the inter-electrode distance T, is superior in terms of temperature uniformity.

FIGS. 9A and 9B are schematic diagrams showing the effect of the pin spacer 201 and the contour of the potential is illustrated by dashed lines. FIG. 9A is a diagram showing a conventional mounting table 2, and FIG. 9B is a diagram showing the mounting table 2 according to the first embodiment. In the conventional mounting table 2 shown in FIG. 9A, the lifter pin 61 is stopped and received at a deep position in the pin hole 200 in order to avoid the lifter pin 61 from being exposed to the plasma. Further, the curvature of the pin upper portion is small. Then, as shown in FIG. 9A, in the mounting table 2 having no pin spacer 201, there is a space Z in which electrons can be accelerated in the pin hole 200. Further, the space Z includes a portion in which electric field distortion is generated. In the portion of the electric field distortion, since the electrons travel in the same place, it is easy to induce discharge. Thus, in the shape and arrangement of the lifter pins 61 of the conventional case, since the wafer W and the lifter pins 61 are not in close proximity, there is a space portion in which electrons can be accelerated between the wafer W and the upper portions of the lifter pins 61. Further, also in a portion of the pin hole 200 in which the lifter pin 61 is received, there is a radial space therebetween. Therefore, electrons may be accelerated to collide with He and the discharge may occur in the radial space.

On the other hand, as shown in FIG. 9B, in the mounting table 2 according to the first embodiment in which the pin spacer 201 is provided, by bringing the lifter pin 61 close to the wafer W, it is possible to reduce the space Z, and the lifter pin 61 may be disposed in a portion in which the distortion of the electric field is generated in the pin hole 200. Further, by increasing the curvature of the pin upper portion 61b, it is possible to further reduce the space Z. That is, since the pin upper portion 61b is disposed close to the wafer W, the space between the wafer W and the pin upper portion 61b can be made smaller than that in the conventional case. Also in the portion of the pin hole 200 receiving the pin main body 61a, since the pin spacer 201 is provided, the radial space therebetween may be made narrower than that in the conventional space. Thus, since the space for accelerating electrons is not provided, it is possible to prevent the discharge in the pin hole 200.

As described above, according to the mounting table 2 according to the first embodiment, by providing the pin sleeve 203 inserted in the pin hole 200 and the pin spacer 201 inserted in the pin sleeve 203, it is possible to narrow the radial space in the pin hole 200. In the state in which the lifter pin 61 is received in the pin hole 200, the spaces between the pin main body 61a and the pin spacer 201 and between the pin upper portion 61b and the backside of the wafer W are made smaller than those in the conventional case. Therefore, it is possible to prevent the abnormal discharge in the space.

Further, as described above, in the mounting table 2 according to the first embodiment, by providing the gas sleeve 204 inserted in the gas supply line 30 (gas hole) and the gas spacer 202 inserted in the gas sleeve 204, it is possible to narrow the radial space in the gas supply line 30. By narrowing the radial space in the gas supply line 30, electrons cannot be accelerated, and discharge is difficult to occur. Therefore, it is possible to prevent the discharge in the gas supply line 30.

FIG. 10 is a table of experimental results showing a relationship between the abnormal discharge trace of the backside of the wafer W and the pressure of He in the mounting table 2 according to the first embodiment. In process 1, a plasma was generated by setting the power of the first RF power supply 10a as 2000 W and the power of the second RF power supply 10b as 4000 W, the pressure of He was set to 0 Torr, and the control temperature of the mounting table 2 was set to 80° C. In process 2, the pressure of He was set to 10 Torr under the conditions of process 1. In process 3, the pressure of He was set to 25 Torr under the conditions of process 1. The hatched sections in FIG. 10 show the pressure of He. With respect to processes 1 to 3, in three pin holes 200 (Pin-1, Pin-2, Pin-3) provided in the mounting table 2 and the gas supply line 30 (gas holes), the observed discharge trace of the backside of the wafer W was checked visually. In the sections of the results, marks of ○ΔX depict the discharge trace of the backside of the wafer W, wherein mark ○ shows a state in which there is no discharge trace and there is no difference from a normal portion, mark Δ shows a state in which a white and dim discharge trace can be seen barely when watched with naked eyes, and mark X shows a state in which a discharge trace can be seen clearly with naked eyes. As shown in FIG. 10, in the plasma processing apparatus including the mounting table 2 according to the first embodiment, it has been confirmed that abnormal discharge can be prevented under conditions that the pressure of He is below 25 Torr.

(Second Embodiment)

Figure 11:
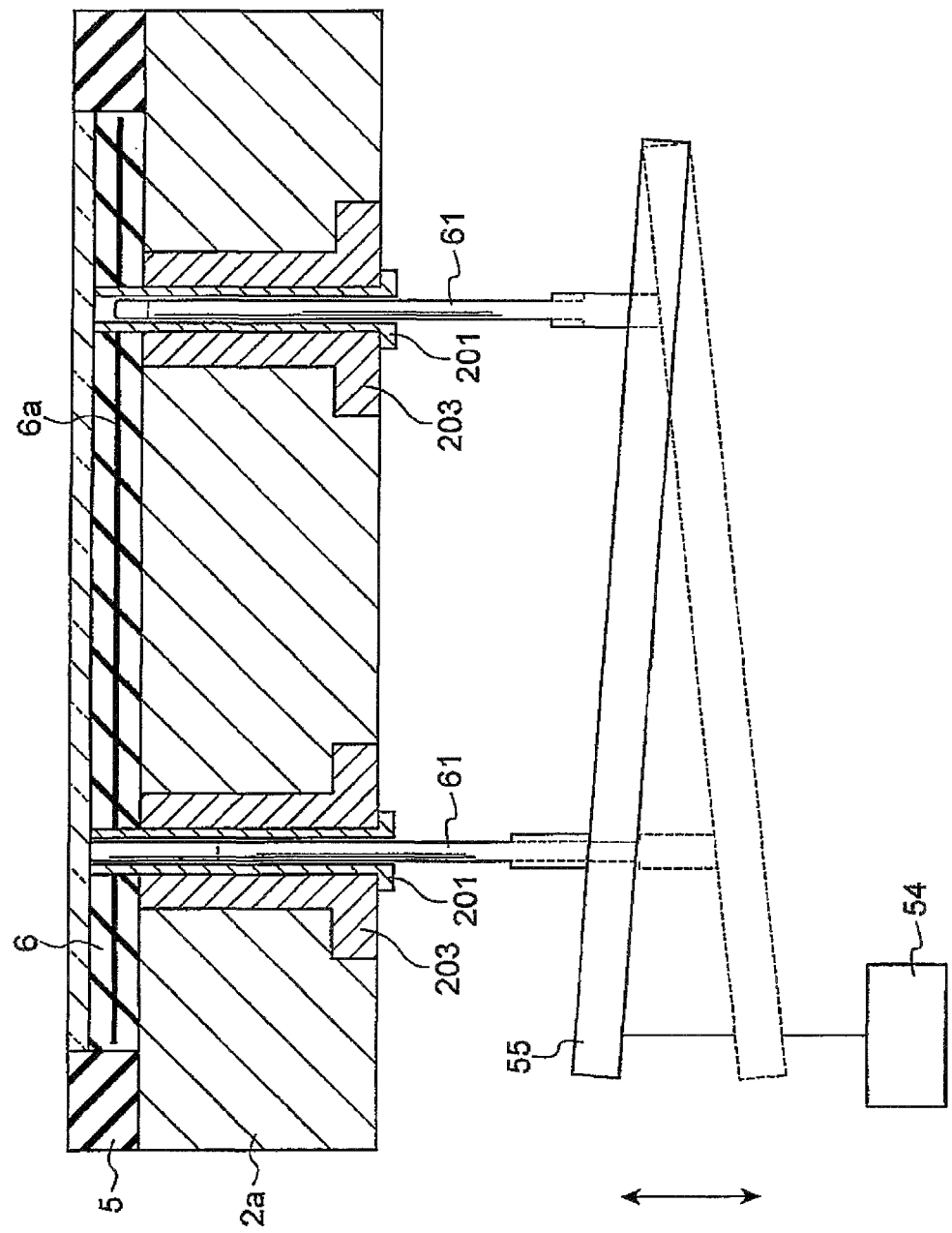
FIG. 11 is a schematic diagram showing the drive mechanism of the lifter pins in the mounting table of FIG. 6.

However, in the mounting table 2 according to the first embodiment, as will be described below, further improvement may be made. FIG. 11 is a schematic diagram showing an outline of the drive mechanism 62 of the lifter pins 61 in the mounting table of FIG. 1. Further, FIG. 11 shows a case of the cross section in which two lifter pins 61 are shown. As shown in FIG. 11, the drive mechanism 62 includes a drive source 54 and a drive member 55 connected to the drive source 54. The drive member 55 has, e.g., a disk shape, and one point of the outer periphery is connected to the drive source 54. Accordingly, a vertical driving force is applied to the connection point with the drive source 54. Further, in the drive member 55, one point of the outer periphery of the drive member 55 opposite to the connection point with the drive source 54 is fixed. The lower ends of the lifter pins 61 are connected to the upper surface of the drive member 55. Although not shown in FIG. 11, three or more lifter pins 61 are disposed on the upper surface of the drive member 55 at regular intervals. If a driving force is applied to the connection point of the drive member 55 with the drive source 54, the drive member 55 is tilted about a fixed point, and the lifter pins 61 are moved up. In case the drive member 55 supporting the lifter pins 61 has a cantilever structure as described above, the drive member 55 may be warped by the load of the lifter pins 61.

Further, even in a so-called double supporting structure in which two drive sources 54 are connected to the opposite points of the outer periphery of the drive member without fixing the drive member 55, when the driving sequences of the drive sources 54 are different from each other, the drive member 55 may be warped. If the drive member 55 is warped, the lifter pins 61 are not able to move up and down precisely in the pin holes 200. Thus, between the inner wall of the pin hole 200 and the lifter pin 61, a clearance (so-called margin) is needed. However, since the radial space is reduced by inserting the pin spacer 201, a sufficient clearance for moving the lifter pin 61 up and down may not exist. Further, the base 2a is thermally expanded because it is formed of conductive metal. Accordingly, the positions of the pin holes 200 may be deviated, or the diameters of the pin holes 200 may be reduced. In this case, if the pin spacers 201 are inserted, the position deviation or reduction in diameter may not be acceptable. Further, the sliding resistance when the lifter pins 61 are moved up and down may increase according to the insertion of the pin spacers 201. From the above, with the measures of preventing the abnormal discharge by reducing the space by the insertion of the pin spacers 201, the function of the lifter pins and the prevention of abnormal discharge may not be compatible properly.

Further, abnormal discharge occurs easily under the conditions that, particularly, the RF frequency is lower and the RF power is higher. This is because a self-bias is increased if the RF frequency is lower and the RF power is higher.

Figure 12:
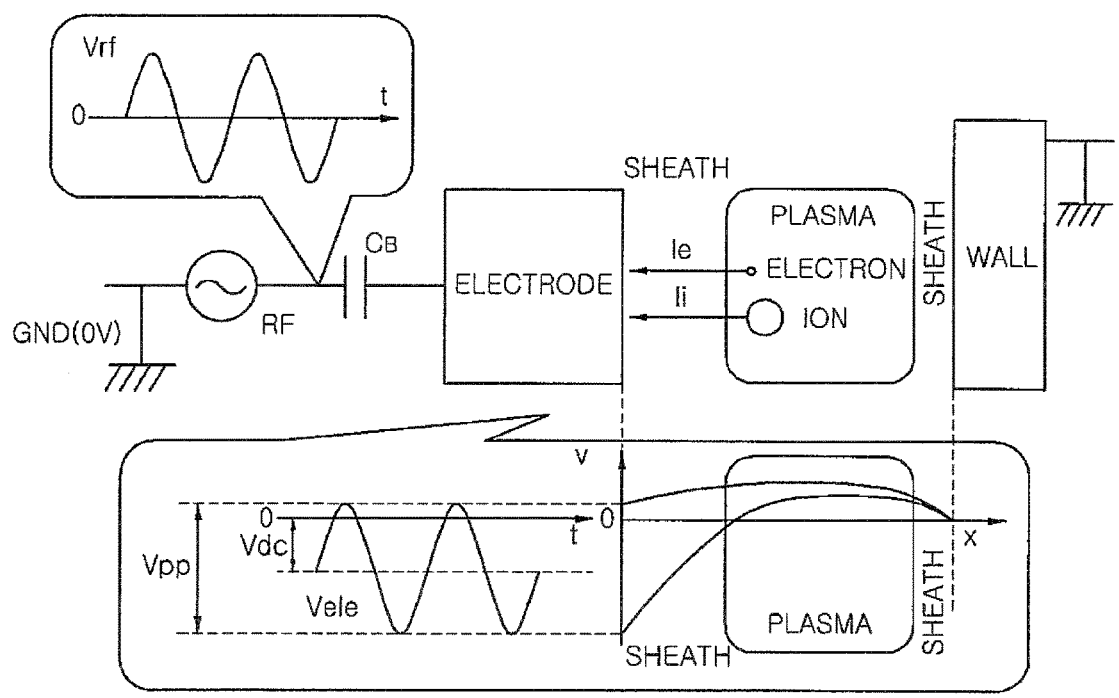
FIG. 12 is a schematic diagram for explaining the self-bias.

First, explanation about the self-bias will be given. FIG. 12 is a schematic diagram for explaining the self-bias. As shown in FIG. 12, a RF power supply is connected via a capacitor $C_B$ to the electrode corresponding to the mounting table 2, and the wall corresponding to the processing chamber 1 is connected to ground. Further, the area of the wall is much larger than the area of the RF electrode. In this case, electrons flowing into the wall are discharged to ground, but electrons flowing into the electrode are stored by the capacitor $C_B$. By storing charges in the capacitor $C_B$, a self-bias $V_{DC}$ which is a negative DC voltage occurs naturally. Further, if the RF waveform of the RF power is set as $V_{RF}$ and the amplitude of the RF power is set as $V_{PP}$, the RF waveform $V_{ele}$ transmitted to the electrode moves as a whole in the negative direction by the amount of the self-bias $V_{DC}$ due to the influence of the capacitor $C_B$ which stores charges from the plasma. Further, when the plasma is generated, by a difference in mass between gas ions and electrons in the plasma, the plasma is positively charged, and a sheath which is a negative bias region is generated between the plasma and the wall and between the plasma and the electrode. In order to stably maintain the sheath, it is necessary to make equal the time average of the charge amount (flow current) of electrons flowing into the electrode from the plasma and the time average of the charge amount (ion current) of ions flowing into the electrode from the plasma. As described above, when the self-bias $V_{DC}$ is generated, the RF waveform $V_{ele}$ transmitted to the electrode is moved downward in the negative direction to shorten the time for which electrons flow into the electrode. Accordingly, the time average of the flow current is made equal to the time average of the ion current, and it is possible to stably maintain the plasma as a result.

Figure 13A:
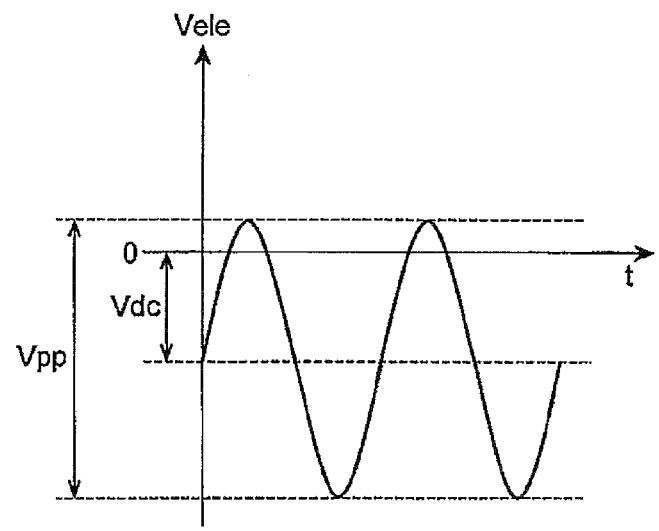
FIGS. 13A and 13B are graphs showing the self-bias of the conditions of low frequency and RF high power.
Figure 13B:
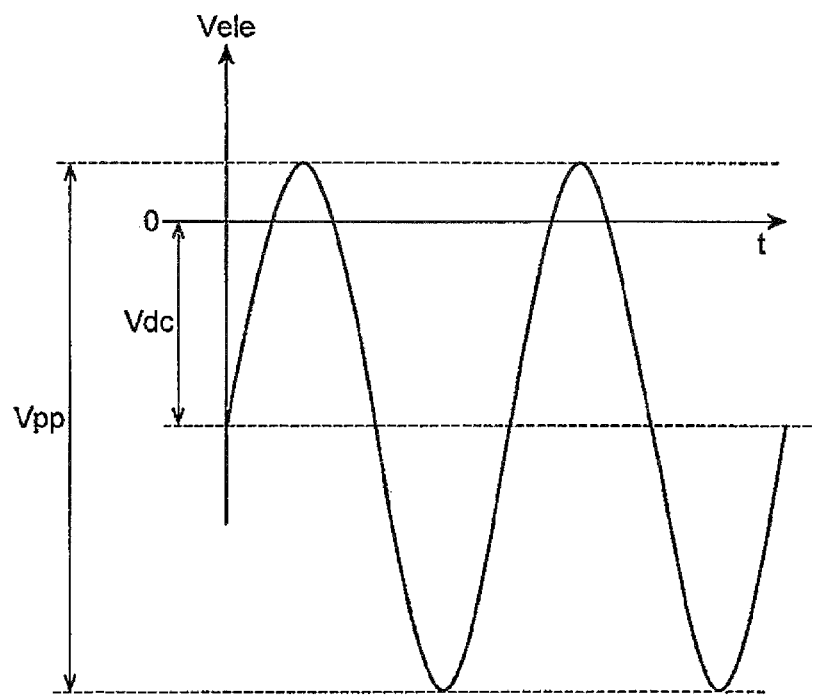

FIG. 13A is an RF waveform of the electrode in the case of setting the RF frequency and the RF power as certain values, and FIG. 13B is an RF waveform in the case of setting the RF frequency as a lower value and the RF power as a higher value than the conditions of the RF waveform shown in FIG. 13A. For example, if the RF power is increased, since the electric field formed by the RF power increases and the kinetic energy of electrons accelerated by the electric field increases, the amount of electrons jumping to the electrode increases, and the self-bias $V_{DC}$ increases. That is, as shown in FIGS. 13A and 13B, in the case where RF application conditions are set as low frequency and high power, the self-bias $V_{DC}$ increases while the amplitude $V_{PP}$ increases.

Figure 14:
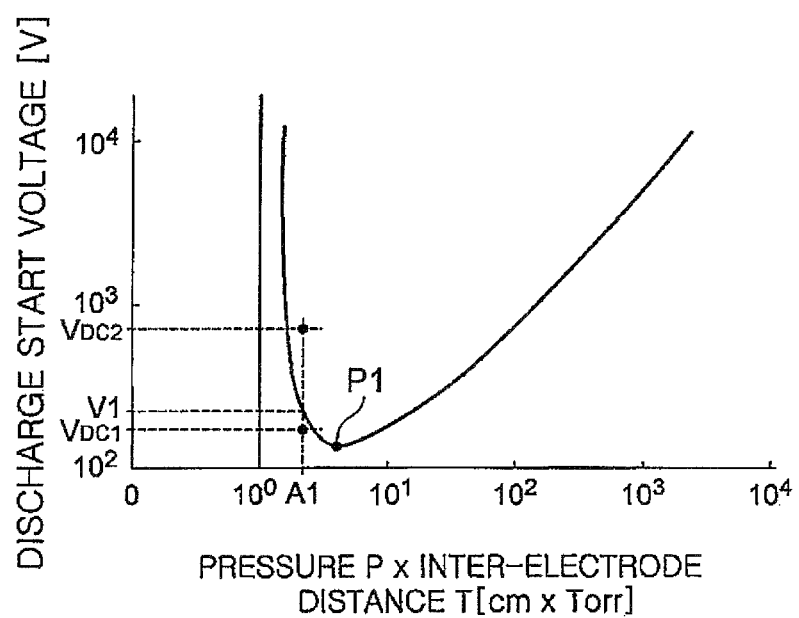
FIG. 14 is a graph for explaining a relationship between the self-bias and the discharge start voltage.

FIG. 14 is a graph explaining that abnormal discharge is likely to occur when the self-bias $V_{DC}$ increases by using a graph of Paschen's law. In this case, the discharge start voltage is assumed to be V1 under a process condition A1. In this case, if the self-bias generated in the mounting table 2 is $V_{DC1}$ smaller than the discharge start voltage V1, abnormal discharge does not occur. However, if the self-bias generated in the mounting table 2 increases, it may exceed the discharge start voltage V1. For example, if $V_{DC2}$ greater than the discharge start voltage V1 is generated, abnormal discharge occurs also under the process condition A1. That is, in the case where RF application conditions are set as low frequency and high power, the self-bias $V_{DC}$ increases and the possibility of exceeding the discharge start voltage V1 increases. Thus, the risk of occurrence of abnormal discharge increases.

Therefore, in order to prevent abnormal discharge even in a wide range of required etching conditions (e.g., a frequency of 500 kHz or less and a RF power of 3000 W or higher), it is not sufficient only to narrow a space in which abnormal discharge is generated between the backside of the wafer W and the electrostatic chuck 6, and measures with a more margin, i.e., eliminating a space that generates abnormal discharge is more effective.

Based on the above consideration, a second embodiment of the present invention will be described. In the description of the present embodiment, an explanation on parts identical to those of the first embodiment will be omitted and differences will be described mainly.

Figure 15:
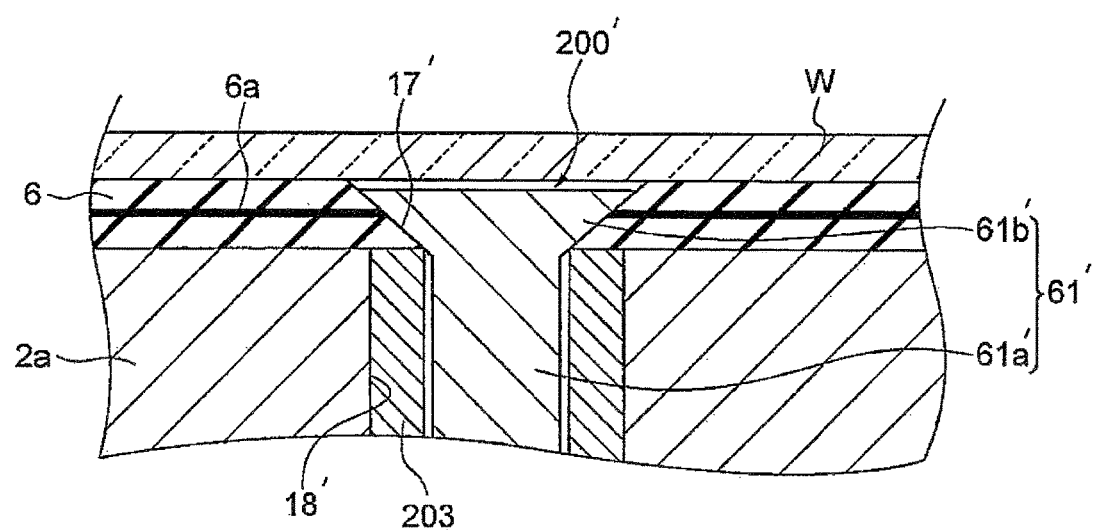
FIG. 15 is a schematic cross-sectional view showing a configuration of the lifter pin and the pin hole in the mounting table according to a second embodiment.

FIG. 15 is a schematic cross-sectional view showing a configuration of a lifter pin and a pin hole in the mounting table according to the second embodiment. The pin hole 200' in the present embodiment includes a first through hole 17' and a second through hole 18'. Further, an upper end portion of the pin hole 200' is formed by the first through hole 17', and a lower end portion of the pin hole 200' is formed by the second through hole 18'. The first through hole 17' has a shape in which the diameter decreases gradually toward the lower end of the pin hole 200'. That is, the first through hole 17' has a tapered shape in which the diameter decreases toward the lower side of the mounting table 2'.

A pin upper portion 61b' of the lifter pin 61' has a shape in which the diameter decreases gradually toward the pin main body 61a' (lower side). That is, the pin upper portion 61b' has an inversely tapered shape having a section (outer diameter) that increases toward the upper side of the mounting table 2' so as to correspond to the shape of the first through hole 17'. When the lifter pin 61' is received in the pin hole 200', the outer surface of the pin upper portion 61b' is in surface contact with the inner wall of the first through hole 17'. Thus, in the first through hole 17', a gap between the pin upper portion 61b' and the inner wall of the first through hole 17', i.e., a radial space is eliminated completely.

Figure 16:
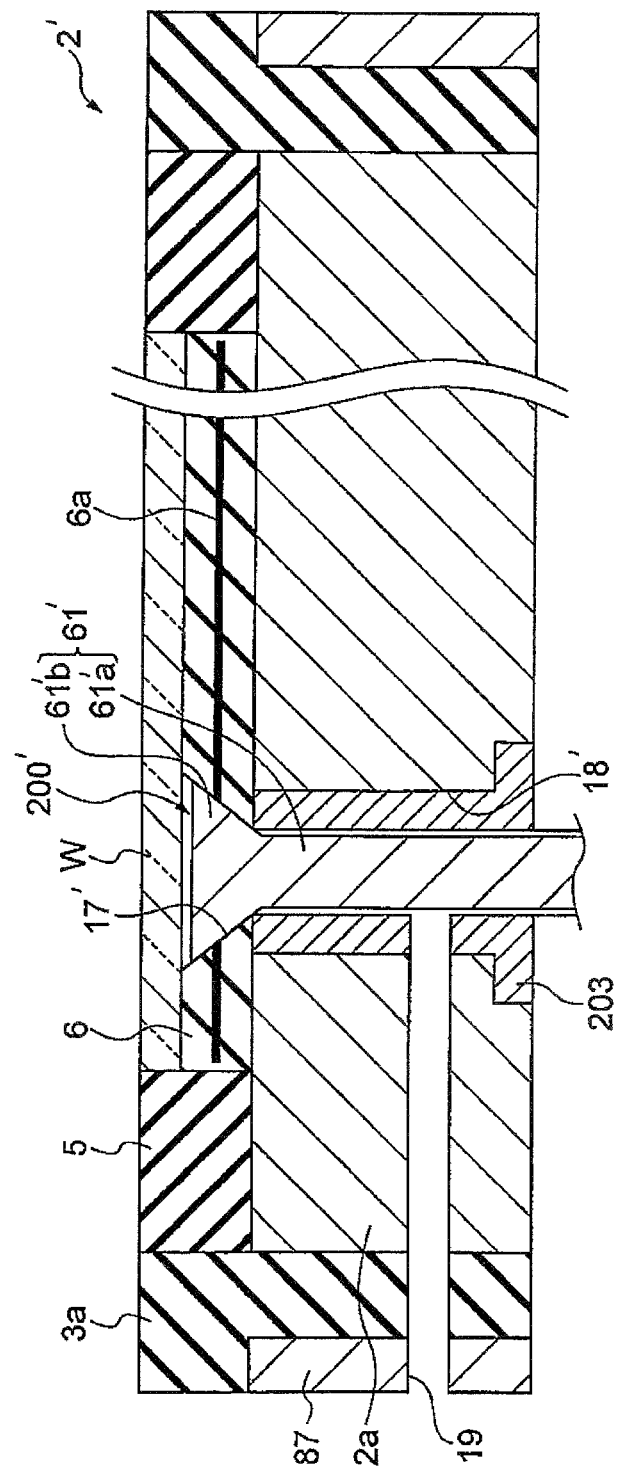
FIG. 16 is a schematic cross-sectional view showing the mounting table according to the second embodiment.

FIG. 16 is a schematic cross-sectional view showing the mounting table according to the second embodiment. As shown in FIG. 16, the pin hole 200' in the mounting table 2' is in communication with an exhaust hole 19. The exhaust hole 19 is open at the sidewall of the mounting table 2'. Thus, the pin hole 200' is in communication with the processing chamber 1 of the plasma processing apparatus including the mounting table 2'. Gas present in the space between the inner wall of the second through hole 18' and the pin main body 61a' of the lifter pin 61' is exhausted into the processing chamber 1 through the exhaust hole 19. Further, the exhaust hole 19 may be formed to be open at the sidewall of the support 4 without being limited to being open at the sidewall of the mounting table 2'.

As described above, in the mounting table 2' according to the second embodiment, the pin hole 200' has a shape in which the diameter decreases gradually toward the lower end. The pin upper portion 61b' of the lifter pin 61' has a shape in which the diameter decreases gradually toward the lower end so as to correspond to the shape of the upper end portion of the pin hole 200'. The lifter pin 61' is in surface contact with the inner wall of the upper end portion of the pin hole 200' when it is received in the pin hole 200'. Thus, in the upper end portion of the pin hole 200', it is possible to completely eliminate the radial space. Thus, by eliminating an abnormal discharging space itself, even in a case of setting the RF application conditions as low frequency and high power, it is possible to prevent abnormal discharge. Further, it is possible to achieve both the wafer support function of the lifter pins 61' and the prevention of abnormal discharge.

Further, the pin hole 200' is in communication with the processing chamber 1 through the exhaust hole 19. Gas exhaust may be carried out at any time through the exhaust hole 19. Thus, with only a simple configuration of the exhaust hole 19, it is possible to evacuate the gas present in the space between the pin main body 61a' of the lifter pin 61' and the inner wall of the second through hole 18'. Therefore, since the pressure in the pin hole 200' is reduced, it is possible to realize a state in which abnormal discharge hardly occurs.

While the invention has been shown and described with respect to the embodiments, it will be understood by those skilled in the art that various changes and modification may be made without departing from the scope of the invention as defined in the following claims.

Figure 17:
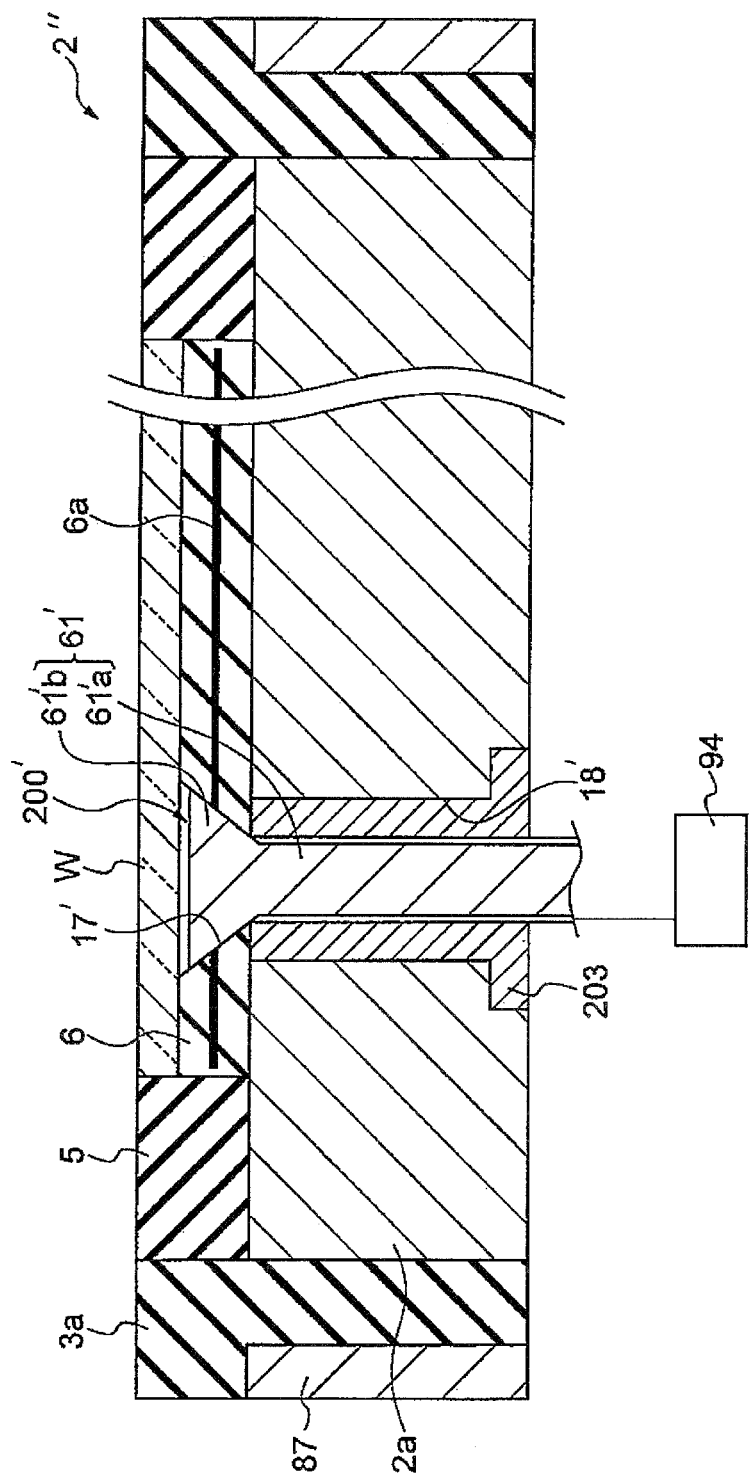
FIG. 17 is a schematic cross-sectional view showing a modification of the mounting table according to the second embodiment.

For example, an exhaust device for reducing the pressure in the pin holes 200' may be provided separately. FIG. 17 is a schematic cross-sectional view showing a modification of the mounting table according to the second embodiment. The plasma processing apparatus having the mounting table 2" includes a second exhaust device 94 provided at a position different from that of the first gas exhaust unit 83 for evacuating the processing chamber 1. The pin holes 200' are connected to the second exhaust device 94. That is, each of the pin holes 200' is configured as a part of an exhaust passage connecting the inside of the processing chamber 1 to the second exhaust device 94. In the plasma processing apparatus including the mounting table 2" according to this modification, it is possible to evacuate the inside of the pin holes 200' at a desired timing by the second exhaust device 94. Therefore, it is possible to control the exhaust of gas in the pin holes 200' independently of the exhaust control of the processing chamber 1. Also, since the pressure in the pin holes 200' is reduced, it is possible to realize a state in which abnormal discharge hardly occurs similarly to the plasma processing apparatus including the mounting table 2' of FIG. 16. Further, the second exhaust device 94 may be provided in plural to correspond to the pin holes 200' respectively.

Further, the first through hole 17' is formed in a tapered shape and the pin upper portion 61b' is formed in an inversely tapered shape in the second embodiment, but it is not limited thereto as long as the pin upper portion 61b' has a shape to be in surface contact with the inner wall of the first through hole 17' when the lifter pin 61' is received in the pin hole 200'. For example, it may have a variety of shapes such as a mortar shape. Further, it is not necessary to form the entire first through hole 17' to have a tapered shape. That is, only the upper end part of the first through hole 17' may be tapered, or only the lower end part of the first through hole 17' may be tapered.

Further, a case where the upper end portion of the pin hole 200' is the first through hole 17' has been described in the second embodiment, but the upper end portion of the pin hole 200' may be the first through hole 17' and a part of the second through hole 18'. That is, the tapered portion may be formed by the first through hole 17' and a part of the second through hole 18'. Alternatively, the upper end part of the pin hole 200' may be first through hole 17' and a part of the pin sleeve 203. That is, the tapered portion may be formed by the first through hole 17' and part of the pin sleeve 203.

Further, the pin hole 200' according to the second embodiment may be configured to prevent abnormal discharge by using the pin spacer 201 described in the first embodiment.

Further, in the first embodiment and the second embodiment, the plasma processing apparatus may be configured to use a plasma generated in a radial line slot antenna.

What is claimed is:
1. A mounting table, comprising:
   an electrostatic chuck having a mounting surface on which a processing target is to be mounted and a backside surface opposite to the mounting surface, a first through hole being formed in the electrostatic chuck;
   a base joined to the backside surface of the electrostatic chuck and having a second through hole with a diameter larger than a diameter of the first through hole and in communication with the first through hole;
   a cylindrical sleeve inserted in the second through hole and formed of an insulating material; and
   a lifter pin which is received in a pin hole formed by the first through hole and the second through hole, the lifter pin being movable up and down to protrude beyond and retract below the mounting surface so as to transfer the processing target in a vertical direction,
   a cylindrical spacer inserted in the cylindrical sleeve and in the first through hole and made of an insulating material,
   wherein the cylindrical sleeve is in contact with the base in the second through hole and a top end of the cylindrical sleeve is in contact with the backside surface of the electrostatic chuck,
   wherein the cylindrical spacer has an accommodating portion and a flange portion, the accommodation portion extending from a bottom end of the cylindrical sleeve up to the mounting surface of the electrostatic chuck and the flange portion having a flange shape protruding outwardly in a radial direction of the accommodation portion, wherein an upper surface of the flange portion faces a lower surface of the base, and
   wherein the cylindrical sleeve has a flange portion,
   wherein the flange portion of the cylindrical sleeve and a portion of the accommodation portion of the cylindrical spacer are provided in the second through hole of the base.

2. The mounting table of claim 1, wherein the cylindrical sleeve is formed of a ceramic and the cylindrical spacer is formed of a resin.

3. The mounting table of claim 1, wherein the electrostatic chuck is configured to electrostatically attract the processing target.

4. The mounting table of claim 1, wherein an outer surface of the cylindrical spacer in said cylindrical sleeve is adjacent to an inner surface of said cylindrical sleeve, and an outer surface of the cylindrical spacer in said first through hole is adjacent to the electrostatic chuck.

5. The mounting table of claim 1, wherein an exhaust hole connected to the pin hole is formed in the mounting table, one end of the exhaust hole is open at a sidewall of the cylindrical spacer and the other end of the exhaust hole is open at a sidewall of the base.

6. A mounting table, comprising:
   a base;
   an electrostatic chuck arranged on the base, the electrostatic chuck having a mounting surface on which a processing target is to be mounted;
   a first hole extending through the base and the electrostatic chuck;
   a second hole extending through the base and the electrostatic chuck;
   a lifter pin which is received in the first hole, the lifter pin being movable up and down to protrude beyond and retract below the mounting surface so as to transfer the processing target in a vertical direction;
   a first sleeve and a second sleeve respectively inserted in a first hole portion and in a second hole portion in the base, the first sleeve and the second sleeve being formed of an insulating material;
   a first spacer inserted in the first sleeve and in a first hole portion in the electrostatic chuck, the first spacer being formed of an insulating material; and a second spacer inserted in the second sleeve and in a second hole portion in the electrostatic chuck, wherein a gas supply path configured to supply a heat transfer gas is formed inside of the second spacer and a radial space in the gas supply path is narrowed by the second sleeve and the second spacer to prevent a discharge in the gas supply path, wherein the second sleeve is in contact with the base in the second hole portion in the base and a top end of the second sleeve is in contact with a backside surface of the electrostatic chuck, wherein the second spacer extends from a bottom end of the second sleeve up to the mounting surface of the electrostatic chuck, wherein the first spacer has an accommodating portion and a flange portion, the accommodation portion extending from a bottom end of the first sleeve up to the mounting surface of the electrostatic chuck and the flange portion having a flange shape protruding outwardly in a radial direction of the accommodation portion, wherein an upper surface of the flange portion faces a lower surface of the base, and wherein the first sleeve has a flange portion.

7. The mounting table of claim 6, wherein the second hole has a larger diameter portion in the base, and said larger diameter portion has a diameter larger than the second hole portion in the electrostatic chuck.

8. The mounting table of claim 6, wherein an upper end portion of the first hole has a tapered shape and an upper end portion of the lifter pin has an inversely tapered shape corresponding to the tapered shape of the upper end portion of the first hole.

9. The mounting table of claim 6, wherein the second spacer has a larger outer diameter portion in the base and a smaller outer diameter portion in the electrostatic chuck.

10. The mounting table of claim 9, wherein an outer surface of the second spacer in said second sleeve is adjacent to an inner surface of said second sleeve, and an outer surface of the second spacer in said second hole portion in the electrostatic chuck is adjacent to the electrostatic chuck.

11. The mounting table of claim 6, wherein the second spacer has a larger inner diameter portion in the base and a smaller inner diameter portion in the electrostatic chuck.

12. The mounting table of claim 6, wherein the second sleeve is formed of a ceramic and the second spacer is formed of a resin.

13. The mounting table of claim 6, wherein the electrostatic chuck is configured to electrostatically attract the processing target.

14. The mounting table of claim 6, wherein an outer surface of the second spacer in said second sleeve is adjacent to an inner surface of said second sleeve, and an outer surface of the second spacer in said second hole portion in the electrostatic chuck is adjacent to the electrostatic chuck.

15. The mounting table of claim 6, wherein the first sleeve is in contact with the base in the first hole portion in the base and a top end of the first sleeve is in contact with a backside surface of the electrostatic chuck.

16. The mounting table of claim 6, wherein an exhaust hole connected to the first hole is formed in the mounting table, one end of the exhaust hole is open at a sidewall of the first spacer and the other end of the exhaust hole is open at a sidewall of the base.

* * * * *